US012727352B2

(12) United States Patent
Hu et al.

(10) Patent No.: US 12,727,352 B2
(45) Date of Patent: Sep. 1, 2026

(54) DISPLAY SUBSTRATE HAVING A WIRING COMPRISING A FIRST SUB-LAYER AND A SECOND SUB-LAYER, METHOD FOR MANUFACTURING THE DISPLAY SUBSTRATE, AND DISPLAY DEVICE

(71) Applicants: Mianyang BOE Optoelectronics Technology Co., Ltd., Mianyang (CN); BOE Technology Group Co., Ltd., Beijing (CN)

(72) Inventors: Jing Hu, Beijing (CN); Jinjie Liu, Beijing (CN); Jie Tu, Beijing (CN); Ziyi Liu, Beijing (CN); Haifeng Xu, Beijing (CN); Zifeng Wang, Beijing (CN)

(73) Assignees: Mianyang BOE Optoelectronics Technology Co., Ltd., Mianyang (CN); BOE Technology Group Co., Ltd., Beijing (CN)

( * ) Notice: Subject to any disclaimer, the term of this patent is extended or adjusted under 35 U.S.C. 154(b) by 486 days.

(21) Appl. No.: 18/031,117

(22) PCT Filed: Apr. 19, 2022

(86) PCT No.: PCT/CN2022/087690

§ 371 (c)(1),
(2) Date: Apr. 10, 2023

(87) PCT Pub. No.: WO2023/201524

PCT Pub. Date: Oct. 26, 2023

(65) Prior Publication Data

US 2024/0373707 A1 Nov. 7, 2024

(51) Int. Cl.
*H10K 59/131* (2023.01)
*H10K 59/12* (2023.01)

(52) U.S. Cl.
CPC ..... *H10K 59/1315* (2023.02); *H10K 59/1201* (2023.02)

(58) Field of Classification Search
CPC ........................ H10K 59/1315; H10K 59/1201
(Continued)

(56) References Cited

U.S. PATENT DOCUMENTS

2021/0202895 A1* 7/2021 Kang .................. H10K 59/873

FOREIGN PATENT DOCUMENTS

| | | |
|---|---|---|
| CN | 111584753 A | 8/2020 |
| WO | 2021035442 A1 | 3/2021 |

OTHER PUBLICATIONS

CN202280000790.6 First office action dated Jun. 13, 2026.

* cited by examiner

*Primary Examiner* — Xia L Cross
(74) *Attorney, Agent, or Firm* — IPro, PLLC

(57) ABSTRACT

Provided is a display substrate. The display substrate includes a base substrate, a wiring, and a first insulation layer. The first insulation layer covers the wiring. The wiring includes a first sub-layer and a second sub-layer. The first sub-layer is disposed on the base substrate, wherein a side wall of the first sub-layer is a first inclined surface. The second sub-layer is disposed on the base substrate and covers the first sub-layer, and the second sub-layer includes a first portion stacked on the first inclined surface, wherein a side wall of the first portion is a second inclined surface. An included angle between the second inclined surface and a bearing surface of the base substrate is less than an included angle between the first inclined surface and the bearing surface of the base substrate.

16 Claims, 8 Drawing Sheets

(58) Field of Classification Search
USPC .......................................................... 257/40
See application file for complete search history.

DISPLAY SUBSTRATE HAVING A WIRING COMPRISING A FIRST SUB-LAYER AND A SECOND SUB-LAYER, METHOD FOR MANUFACTURING THE DISPLAY SUBSTRATE, AND DISPLAY DEVICE

CROSS-REFERENCE TO RELATED APPLICATION

The present disclosure is a U.S. national stage of international application No. PCT/CN2022/087690, filed on Apr. 19, 2022, the content of which is herein incorporated by reference in its entirety.

TECHNICAL FIELD

The present disclosure relates to the field of display devices, and in particular, relates to a display substrate, a method for manufacturing the same, and a display device.

BACKGROUND OF THE INVENTION

Display panels are devices that are capable of displaying images under the drive of electrical signals. In the display panel, the electrical signals are typically transmitted by wirings.

SUMMARY OF THE INVENTION

Embodiments of the present disclosure provide a display substrate, a method for manufacturing the same, and a display device. The technical solutions are as follows.

According to some embodiments of the present disclosure, some embodiments of the present disclosure provide a display substrate. The display substrate includes: a base substrate, a wiring, and a first insulation layer; wherein

- the first insulation layer covers the wiring; and
- the wiring includes a first sub-layer and a second sub-layer; wherein the first sub-layer is disposed on the base substrate, a side wall of the first sub-layer being a first inclined surface, the second sub-layer is disposed on the base substrate and covers the first sub-layer, and the second sub-layer includes a first portion stacked on the first inclined surface, a side wall of the first portion being a second inclined surface, wherein an included angle between the second inclined surface and a bearing surface of the base substrate is less than an included angle between the first inclined surface and the bearing surface of the base substrate.

In some embodiments, the first sub-layer and the second sub-layer are both a stack structure; wherein the stack structure includes an intermediate layer and protection layers disposed on two sides of the intermediate layer, the intermediate layer and the protection layer being conductive layers, a resistance of the intermediate layer being less than a resistance of the protection layer.

In some embodiments, the first sub-layer and the second sub-layer are both a stack structure; wherein the stack structure includes an intermediate layer and protection layers disposed on two sides of the intermediate layer, and contact surfaces of the first sub-layer and the second sub-layer share a same one of the protection layers, the intermediate layer and the protection layer being conductive layers, a resistance of the intermediate layer being less than a resistance of the protection layer.

In some embodiments, the protection layer is a Ti layer, and the intermediate layer is an Al layer.

In some embodiments, a ratio of a thickness of the protection layer to a thickness of the intermediate layer ranges from 1:5 to 1:10.

In some embodiments, the included angle between the second inclined surface and the bearing surface of the base substrate ranges from 20 to 50 degrees.

In some embodiments, the first insulation layer is an inorganic layer.

In some embodiments, the wiring is a gate electrode wiring, a source-drain electrode wiring, a common electrode wiring, or a power supply wiring.

According to some embodiments of the present disclosure, a method for manufacturing a display substrate is provided. The method includes:

- providing a base substrate;
- forming a wiring on the base substrate, wherein the wiring includes a first sub-layer and a second sub-layer; wherein the first sub-layer is disposed on the base substrate, a side wall of the first sub-layer being a first inclined surface, the second sub-layer is disposed on the base substrate and covers the first sub-layer, and the second sub-layer includes a first portion stacked on the first inclined surface, a side wall of the first portion being a second inclined surface, wherein an included angle between the second inclined surface and a bearing surface of the base substrate is less than an included angle between the first inclined surface and the bearing surface of the base substrate; and
- forming an insulation layer covering the wiring on the base substrate.

In some embodiments, forming the wiring on the base substrate includes:

- depositing a first material stack on the base substrate, wherein the first material stack includes an intermediate material and protection materials disposed on two sides of the intermediate material;
- acquiring the first sub-layer by patterning the first material stack;
- forming a second material stack covering the first sub-layer on the base substrate, wherein the second material stack includes an intermediate material and protection materials disposed on two sides of the intermediate material; and
- acquiring the second sub-layer by patterning the second material stack; wherein the first sub-layer and the second sub-layer are both a stack structure, wherein the stack structure includes an intermediate layer and protection layers disposed on two sides of the intermediate layer, the intermediate layer and the protection layer being conductive layers, a resistance of the intermediate layer being less than a resistance of the protection layer.

In some embodiments, forming the wiring on the base substrate includes:

- depositing a third material stack on the base substrate, wherein the third material stack includes an intermediate material and a protection material disposed between the intermediate material and the base substrate;
- acquiring a stack pattern by patterning the third material stack;
- forming a second material stack covering the stack pattern on the base substrate, wherein the second material stack includes an intermediate material and protection materials disposed on two sides of the intermediate material; and acquiring the first sub-layer and the second sub-layer by patterning the second material stack; wherein the first sub-layer and the second sub-layer are both a stack structure, wherein the stack structure includes an intermediate layer and protection layers disposed on two sides of the intermediate layer, and contact surfaces of the first sub-layer and the second sub-layer share a same one of the protection layers, the intermediate layer and the protection layer being conductive layers, a resistance of the intermediate layer being less than a resistance of the protection layer.

According to some embodiments of the present disclosure, a display device is provided. The display device includes a power supply and the display substrate as described above, wherein the power supply is connected to the display substrate.

BRIEF DESCRIPTION OF DRAWINGS

For clearer descriptions of the technical solutions in the embodiments of the present disclosure, the following briefly introduces the accompanying drawings to be required in the descriptions of the embodiments. Apparently, the accompanying drawings in the following description show merely some embodiments of the present disclosure, and persons of ordinary skills in the art may still derive other drawings from these accompanying drawings without creative efforts.

DETAILED DESCRIPTION

The present disclosure is described in further detail with reference to the accompanying drawings, to clearly present the objects, technical solutions, and advantages of the present disclosure.

It should be noted that unless otherwise defined, technical or scientific terms used in the embodiments of the present disclosure shall have ordinary meanings understandable by persons of ordinary skill in the art to which the disclosure belongs. The terms "first," "second," and the like used in the embodiments of the present disclosure are not intended to indicate any order, quantity, or importance, but are merely used to distinguish the different components. The terms "comprise," "include," and derivatives or variations thereof are used to indicate that the element or object preceding the terms covers the element or object following the terms and its equivalents, and shall not be understood as excluding other elements or objects. The terms "connect," "contact," and the like are not intended to be limited to physical or mechanical connections, but may include electrical connections, either direct or indirect connection. The terms "on," "under," "left," and "right" are only used to indicate the relative positional relationship. When the absolute position of the described object changes, the relative positional relationship may change accordingly.

During manufacturing of the wiring, the wiring is acquired by first depositing conductive materials and then patterning the conductive materials by performing dry etching.

Upon patterning, an inclined surface with a large inclination angle is formed on the side edge of the wiring, such that an insulation layer, which is above the wiring and in contact with the inclined surface, is subject to a large stress, and thus the insulation layer is at greater risks of cracks. The crack of the insulation layer causes a short circuit or a tunneling current to occur in the display panel.

Figure 1:
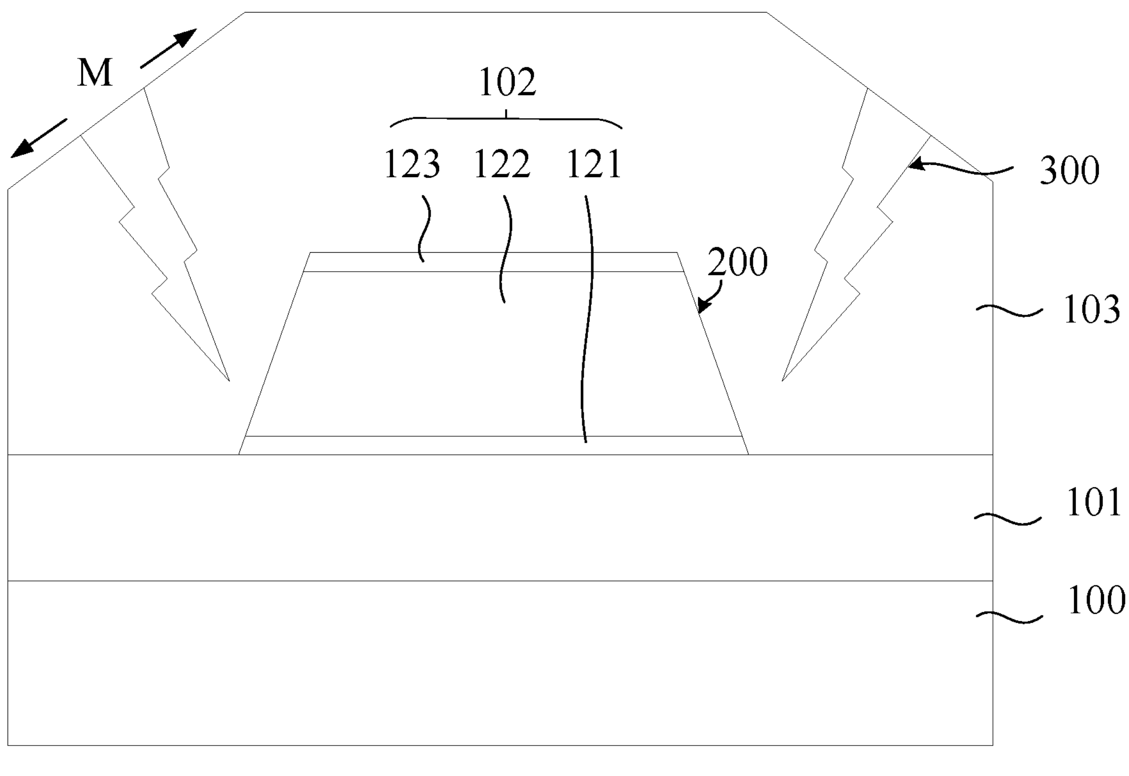
FIG. 1 is a schematic diagram of a portion of film layers of a display substrate in some practices.

FIG. 1 is a schematic diagram of a portion of film layers of a display substrate in some practices. Referring to FIG. 1, the display substrate includes a base substrate 100, and a second insulation layer 101, a wiring 102, and a first insulation layer 103 that are successively stacked on the base substrate 100.

Descriptions are given using a scenario where the wiring 102 is a gate electrode wiring and the wiring 102 uses a Ti/Al/Ti stack structure as an example. Ti, Al, and Ti are respectively indicated by 121, 122, and 123 in FIG. 1. When manufacturing the wiring using the Ti/Al/Ti stack structure, a Ti/Al/Ti layer is usually deposited first and then the deposited layer is patterned by dry etching. Upon patterning, an inclined surface with a large inclination angle is formed on a side edge of the Ti/Al/Ti wiring, as indicated by the reference numeral 200 illustrated in FIG. 1, such that the first insulation layer 103 that is above the wiring and in contact with the inclined surface is subject to a large tension stress, as indicated by two arrows M illustrated in FIG. 1. As a result of the tension stress, a crack 300 is formed in the first insulation layer 103, such that a short circuit or a tunneling current occurs in the display substrate.

Figure 2:
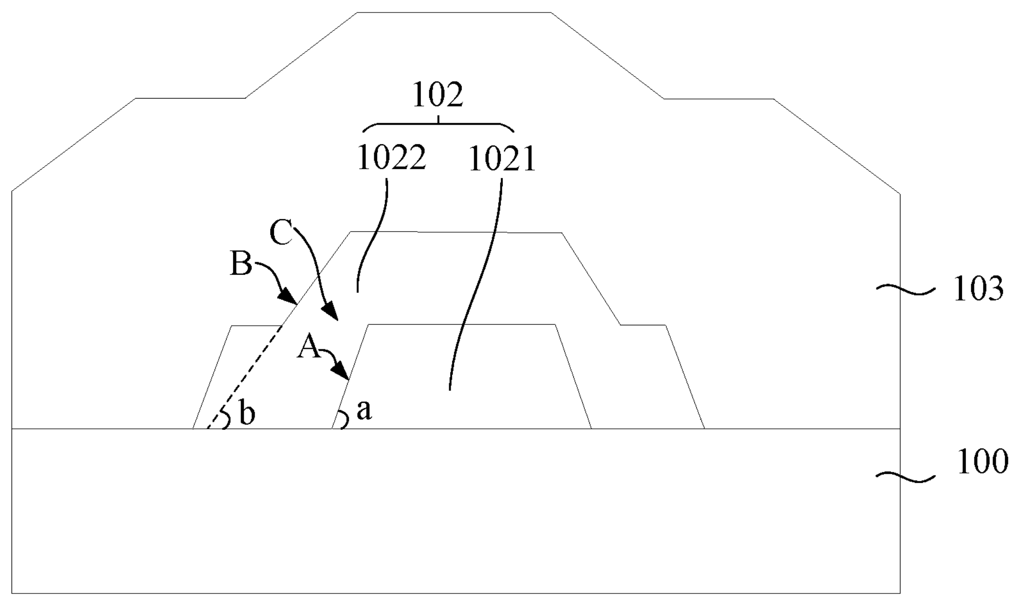
FIG. 2 is a schematic diagram of a portion of film layers of a display substrate according to some embodiments of the present disclosure.

FIG. 2 is a schematic diagram of a portion of film layers of a display substrate according to some embodiments of the present disclosure. Referring to FIG. 2, the display substrate includes a base substrate 100, a wiring 102, and a first insulation layer 103.

As illustrated in FIG. 2, the wiring 102 includes a first sub-layer 1021 and a second sub-layer 1022.

The first sub-layer 1021 is disposed on the base substrate 100, and a side wall of the first sub-layer 1021 is a first inclined surface A. The second sub-layer 1022 is disposed on the base substrate 100 and covers the first sub-layer 1021. The second sub-layer 1022 includes a first portion C stacked on the first inclined surface A, and a side wall of the first portion C is a second inclined surface B. An included angle b between the second inclined surface B and a bearing surface of the base substrate 100 is less than an included angle a between the first inclined surface A and the bearing surface of the base substrate 100.

The first inclined surface A and the second inclined surface B herein refer to surfaces that are inclined with respect to the bearing surface of the base substrate 100. The bearing surface of the base substrate 100 refers to a surface, toward the wiring, of the substrate 100, which is configured to bear other film layers placed thereon and is therefore referred to as the bearing surface.

In some embodiments of the present disclosure, the first sub-layer and the second sub-layer covering the first sub-layer are formed on the base substrate, wherein the second sub-layer includes the first portion stacked on the first inclined surface of the first sub-layer, the side wall of the first portion is the second inclined surface, and the included angle between the second inclined surface and the bearing surface of the base substrate is less than the included angle between the first inclined surface and the bearing surface of the base substrate. In this way, the included angle between the inclined surface, proximal to the insulation layer above the wiring, of the wiring and the bearing surface of the base substrate is small, such that the problem that the inclination angle of the wiring is large in some practices is addressed, and the insulation layer above the wiring is prevented from cracking, and thus the quality of the display substrate is ensured.

It should be noted that the second sub-layer includes, in addition to the first portion, a second portion stacked on the base substrate 100 and a third portion stacked to an upper surface of the first sub-layer, wherein the first portion is connected between the second portion and the third portion.

In some embodiments of the present disclosure, the wiring 102 is directly disposed on the base substrate 100 and no film layer is arrangeable between the wiring 102 and the base substrate 100. In other embodiments of the present disclosure, the wiring 102 is indirectly disposed on the base substrate 100, and an insulation layer is arrangeable between the wiring 102 and the base substrate 100.

In some embodiments of the present disclosure, the first sub-layer 1021 and the second sub-layer 1022 are both a stack structure. The stack structure includes an intermediate layer and protection layers disposed on two sides of the intermediate layer. The intermediate layer and the protection layer are conductive layers, and a resistance of the intermediate layer is less than a resistance of the protection layer.

Exemplarily, the protection layer is a titanium (Ti) layer and the intermediate layer is an aluminum (Al) layer. In this case, the first sub-layer 1021 and the second sub-layer 1022 are both a Ti/Al/Ti stack structure.

Figure 3:
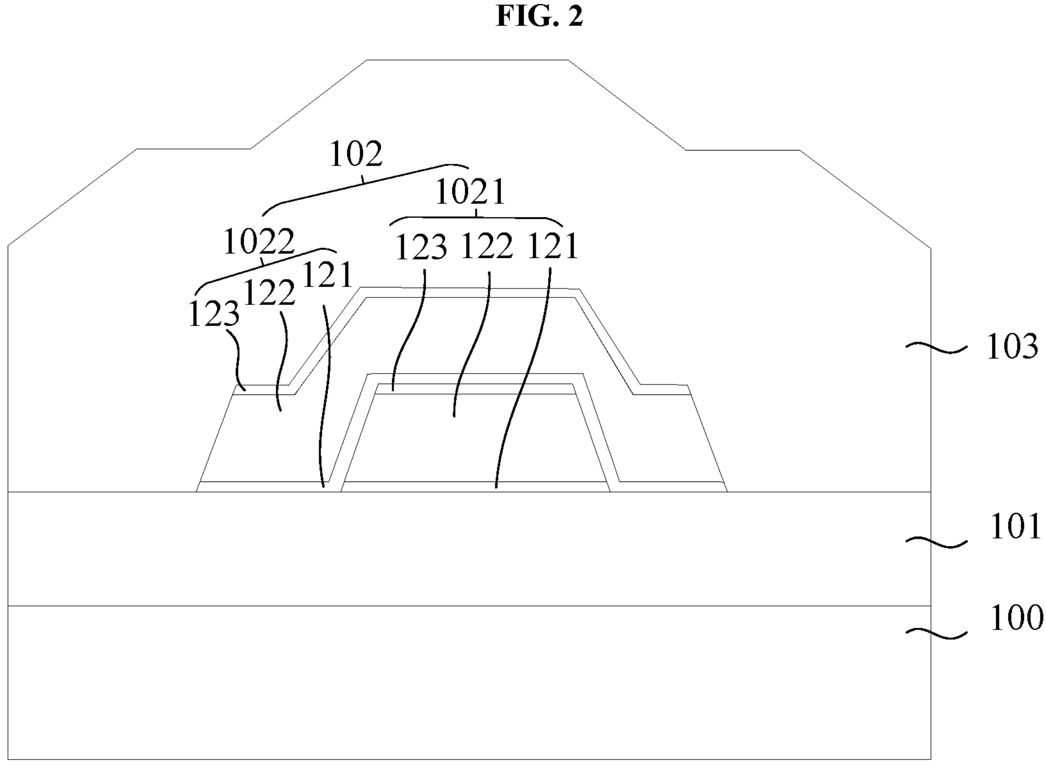
FIG. 3 is a schematic diagram of a portion of film layers of another display substrate according to some embodiments of the present disclosure.

FIG. 3 is a schematic diagram of a portion of film layers of another display substrate according to some embodiments of the present disclosure. Referring to FIG. 3, the first sub-layer 1021 and the second sub-layer 1022 are both the Ti/Al/Ti stack structure, and Ti, Al, and Ti are respectively indicated by reference numerals 121, 122, and 123.

In the above embodiments, materials used for the stack structure and the number of layers of the stack structure are exemplary. In other embodiments, other materials are used, or the stack with more or fewer layers is formed.

In some embodiments of the present disclosure, the first sub-layer 1021 and the second sub-layer 1022 are both a stack structure. The stack structure includes an intermediate layer and protection layers disposed on two sides of the intermediate layer, and contact surfaces of the first sub-layer 1021 and the second sub-layer 2022 share a same one of the protection layers. The intermediate layer and the protection layer are conductive layers and a resistance of the intermediate layer is less than a resistance of the protection layer.

Figure 4:
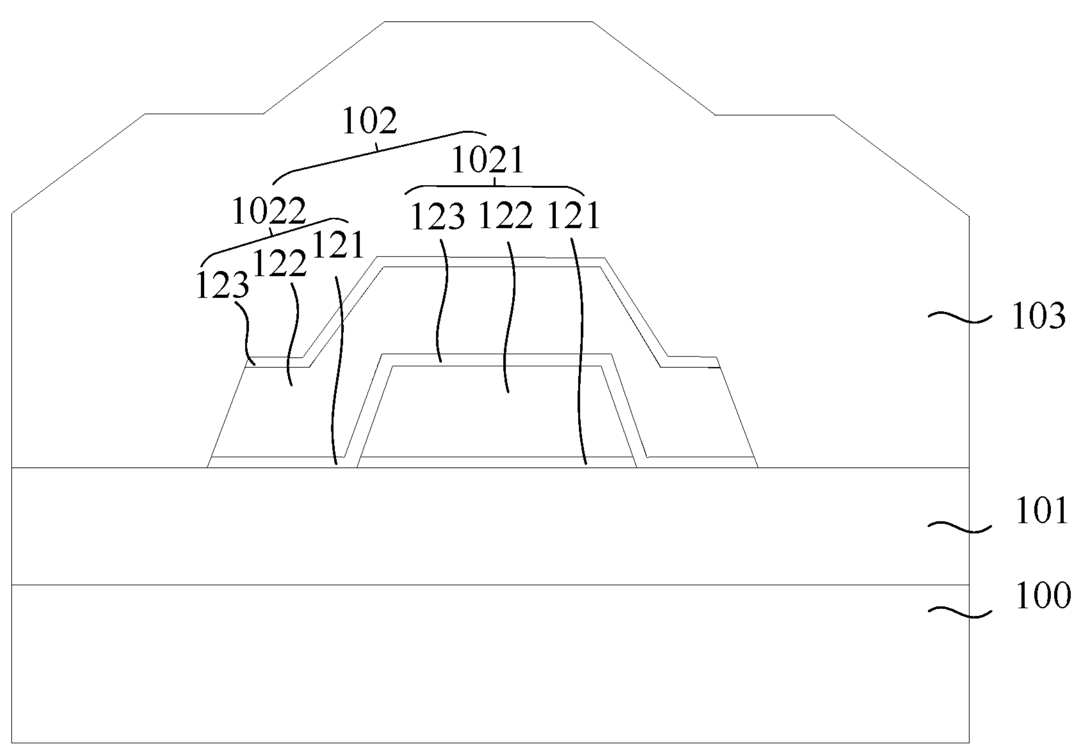
FIG. 4 is a schematic diagram of a portion of film layers of still another display substrate according to some embodiments of the present disclosure.

FIG. 4 is a schematic diagram of a portion of film layers of still another display substrate according to some embodiments of the present disclosure. Referring to FIG. 4, the first sub-layer 1021 and the second sub-layer 1022 are both the Ti/Al/Ti stack structure, and the contact surfaces of the first sub-layer 1021 and the second sub-layer 1022 share the same Ti layer. Ti, Al, and Ti are respectively indicated by reference numerals 121, 122, and 123.

According to the embodiments illustrated in FIG. 4, the number of protection layers is reduced, such that the materials are saved and the manufacturing process is simplified.

In addition to Ti and Al, other conductive materials are also available for the stack structures in FIG. 3 and FIG. 4, as long as the conditions of the protection layer and the intermediate layer are satisfied.

In some embodiments of the present disclosure, a ratio of a thickness of the protection layer to a thickness of the intermediate layer ranges from 1:5 to 1:10. The ratio of the thicknesses is a ratio of a thickness of a single protection layer to a thickness of a single intermediate layer. In the stack structure, the thicknesses of different protection layers are the same or different, and the thicknesses of different intermediate layers are the same or different.

Using the Ti/Al/Ti stack structure as an example, the wiring is mainly made of Al due to the small resistance of Al, and thus a thickness of an Al layer is large; and a Ti layer is used to wrap the Al layer to prevent the Al layer from being subject to high temperature and having bulges and burrs, and thus a thickness of the Ti layer is small.

Exemplarily, the ratio of the thickness of the protection layer to the thickness of the intermediate layer is 1:5.

In other embodiments, the ratio of the thickness of the protection layer to the thickness of the intermediate layer is another value, which is not limited herein.

In other embodiments of the present disclosure, the first sub-layer 1021 and the second sub-layer 1022 are both a single-layer structure.

Exemplarily, the first sub-layer 1021 and the second sub-layer 1022 are both a metal or metal oxide single-layer structure, such as copper (Cu) layers or indium tin oxide layers.

In the above embodiments, the first sub-layer and the second sub-layer are made of the same material; and in other embodiments, the first sub-layer and the second sub-layer are made of different materials.

In some embodiments of the present disclosure, the included angle b between the second inclined surface and the bearing surface of the base substrate ranges from 20 to 50 degrees.

Exemplarily, the included angle b between the second inclined surface and the bearing surface of the base substrate ranges from 20 to 50 degrees. For example, the included angle b between the second inclined surface and the bearing surface of the base substrate is 30 degrees.

By depositing the material of the second sub-layer 1022 on the base substrate on which the first sub-layer 1021 is formed, the included angle b between the acquired second inclined surface and the bearing surface of the base substrate ranges from 30 to 40 degrees, which is significantly reduced compared with the included angle of 70 to 90 degrees between the etched inclined surface, acquired by dry etching, of the wiring and the bearing surface of the base substrate in some practices. During deposition of the material of the second sub-layer on the first inclined surface, due to the first inclined surface of the first sub-layer, the material slides down from the first inclined surface, such that a thickness of the material at a bottom of the inclined surface is greater than a thickness of the material at a top of the inclined surface, and in this case, an inclination angle of the formed second inclined surface is reduced. The inclination angle of the second inclined surface is related to the type of the deposited material. Using the Ti/Al/Ti stack structure as an example, the included angle b between the acquired second inclined surface and the bearing surface of the base substrate usually ranges from 30 to 40 degrees.

It should be noted that an included angle between an inclined surface, acquired by performing dry etching on the second sub-layer 1022, and the bearing surface of the base substrate does not change a lot compared with the included angle of the inclined surface of the first sub-layer 1021 and the bearing surface of the base substrate. In some embodiments of the present disclosure, the small inclination angle of the inclined surface of the second sub-layer 1022 is mainly due to the small inclination angle of the inclined surface formed by depositing the second sub-layer 1022 on the inclined surface of the first sub-layer 1021, and the formed inclined surface is opposite to the insulation layer above the inclined surface, such that the stress on the insulation layer is reduced and thus the crack is avoided.

As illustrated in FIG. 2 and FIG. 3, the display substrate further includes a second insulation layer 101. The second insulation layer 101 is disposed on the base substrate 100 and the wiring 102 is disposed between the second insulation layer 101 and the first insulation layer 103.

In some embodiments of the present disclosure, the first insulation layer 103 is an inorganic layer.

Exemplarily, the first insulation layer 103 is a silicon nitride (SiN) layer.

Inorganic layers are more prone to cracks than organic layers. With the wiring according to some embodiments of the present disclosure, because the included angle between the inclined surface, toward the first insulation layer, of the wiring and the bearing surface of the base substrate is small, the wiring does not cause a risk of cracks of the inorganic layer above the wiring.

In other embodiments, the first insulation layer is an organic layer. Exemplarily, the first insulation layer 103 is an annular resin layer.

In some embodiments of the present disclosure, the base substrate 100 is a glass substrate, a resin substrate, or another type of substrate.

In some embodiments of the present disclosure, the second insulation layer 101 is an inorganic layer or an organic layer.

Exemplarily, the second insulation layer 101 is a silicon nitride layer or an annular resin layer.

In some embodiments of the present disclosure, the wiring 102 is a gate electrode wiring (i.e., a gate line). In the display substrate, because there is usually the inorganic layer above the gate electrode, the risk of cracks of the inorganic layer above the gate electrode is avoided by using the wiring of the above structure for the gate electrode.

In other embodiments of the present disclosure, the wiring 102 is a source-drain electrode wiring (i.e., a data line), a common electrode wiring, a power supply wiring, or another signal wiring.

Figure 5:
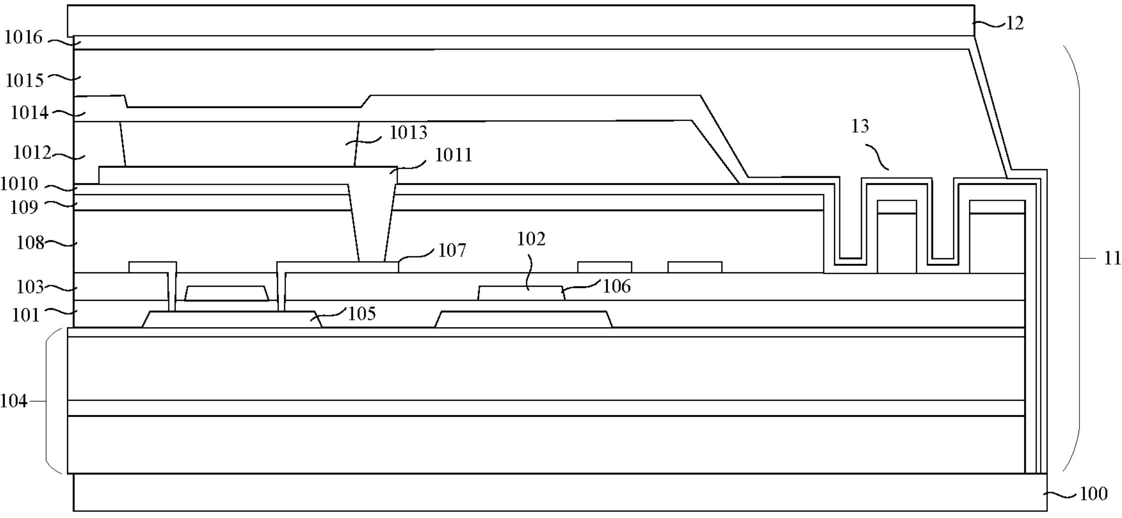
FIG. 5 is a schematic diagram of layers of a display substrate according to some embodiments of the present disclosure.

FIG. 5 is a schematic diagram of layers of a display substrate according to some embodiments of the present disclosure. Referring to FIG. 5, the display substrate includes:

- a base substrate 100, and a display function film layer 11 and a cover plate 12 that are successively arranged on the base substrate 100.

The cover plate 12 is made of an organic transparent material or glass.

Referring to FIG. 5, the display functional film layer 11 includes: a buffer layer 104, an active layer 105, a second insulation layer 101, a gate electrode layer 106, a first insulation layer 103, a source-drain electrode layer 107, a first planarization layer 108, a spacer layer 109, a first encapsulation layer 1010, an anode layer 1011, a pixel definition layer 1012, a light-emitting layer 1013, a cathode layer 1014, a second planarization layer 1015, and a second encapsulation layer 1016.

The first planarization layer 108, the spacer layer 109, the first encapsulation layer 1010, and the cathode layer 1014 are formed with waterproof dikes 13 in a peripheral region for protection against water and oxygen corrosion.

Exemplarily, the buffer layer 104 includes a plurality of sub-layers, such as including two inorganic sub-layers and two organic sub-layers. It should be noted that the above base substrate 100 also acts as a buffer, and thus, the base substrate 100 and the buffer layer 104 together form a buffer layer (BF).

Exemplarily, the active layer 105 is a low-temperature poly-silicon (LTPS) layer. The LTPS has the advantages of high mobility and great stability, which satisfies the requirements of a display with a high resolution.

Exemplarily, the gate electrode layer 106 includes the wiring 102 and the gate electrode.

Exemplarily, the source-drain electrode layer 107 is a metal layer or an indium tin oxide layer. The stability of the transmission of electrical signals in the source-drain electrode layer 107 is ensured.

Exemplarily, the first planarization layer 108 and the second planarization layer 1015 are resin layers. The insulation of the second planarization layer 70 is ensured by an insulation property of the resin.

Exemplarily, the spacer layer 109 is an organic or inorganic insulation spacer layer.

Exemplarily, the anode layer 1011 is a metal layer, a metal oxide layer, or a stack of a metal and a metal oxide, such as aluminum/indium tin oxide (Al/ITO), indium tin oxide/aluminum/indium tin oxide (ITO/Al/ITO), silver/indium tin oxide (Ag/ITO), and indium tin oxide/silver/indium tin oxide (ITO/Ag/ITO). The cathode layer 1014 is a metal layer or a metal oxide layer, such as ITO, indium zinc oxide (IZO), Ag, magnesium (Mg):Ag, Al:Ag, ytterbium (Yb):Ag, or a combination thereof.

Exemplarily, the pixel definition layer 1012 is a hydrophobic material layer, such as a polyfluoroimide layer or a polymethylmethacrylate layer.

Exemplarily, the light-emitting layer 1013 includes a hole injection layer, a hole transport layer, an organic light-emitting layer, an electron transport layer, and an electron injection layer that are stacked. The hole injection layer is made of CuPc, TiOPC, 2-TNATA, and the like; the hole transport layer is made of aromatic amine, pyrazoline, and the like; the electron transport layer is made of coumarin derivatives, conjugated aromatic compounds, and the like; the electron injection layer is made of LiF, MgP, MgF2, Al2O3, and the like; and the organic light-emitting layer is made of Alq3, Almq3, TBADN, and the like.

Exemplarily, the first encapsulation layer 1010 and the second encapsulation layer 1016 are encapsulated by a thin-film encapsulation (TFE) method, such that encapsulation effects are ensured.

It should be noted that only a simple layer structure is illustrated in FIG. 5, and specific shapes of the wiring and insulation layers therein are not illustrated in detail.

The display substrate illustrated in FIG. 5 is a structure of an OLED display substrate. In the OLED display substrate, a gate electrode is formed generally using an A/B/A structure. Therefore, the quality of the OLED display substrate is improved by using the improved wiring according to the present disclosure as the gate electrode wiring.

The display substrate according to the embodiments of the present disclosure is a liquid crystal display substrate or another type of display substrate, which is not limited herein.

Figure 6:
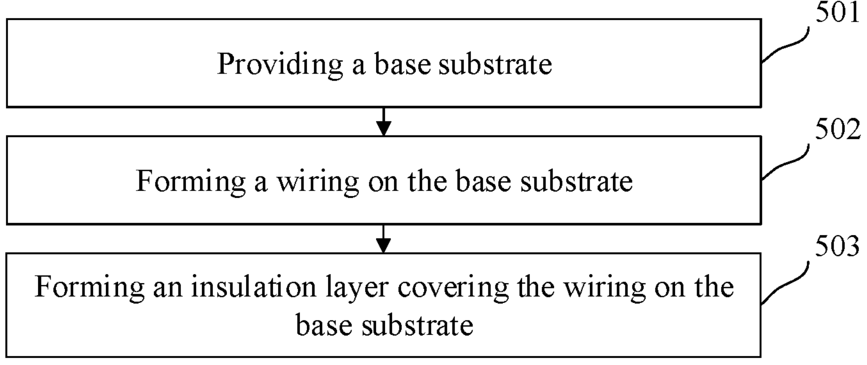
FIG. 6 is a flowchart of a method for manufacturing a display substrate according to some embodiments of the present disclosure.

FIG. 6 is a flowchart of a method for manufacturing a display substrate according to some embodiments of the present disclosure. Referring to FIG. 6, the method includes the following steps.

In step 501, a base substrate is provided.

In step 502, a wiring is formed on the base substrate.

The wiring includes a first sub-layer and a second sub-layer.

The first sub-layer is disposed on the base substrate, and a side wall of the first sub-layer is a first inclined surface. The second sub-layer is disposed on the base substrate and covers the first sub-layer, and the second sub-layer includes a first portion stacked on the first inclined surface, and a side wall of the first portion is a second inclined surface. An included angle between the second inclined surface and a bearing surface of the base substrate is less than an included angle between the first inclined surface and the bearing surface of the base substrate.

In step 503, an insulation layer covering the wiring is formed on the base substrate.

In some embodiments of the present disclosure, the first sub-layer and the second sub-layer covering the first sub-layer are formed on the base substrate, wherein the second sub-layer includes the first portion stacked on the first inclined surface of the first sub-layer, the side wall of the first portion is the second inclined surface, and the included angle between the second inclined surface and the bearing surface of the base substrate is less than the included angle between the first inclined surface and the bearing surface of the base substrate. In this way, the included angle between the inclined surface, proximal to the insulation layer above the wiring, of the wiring and the bearing surface of the base substrate is small, such that the problem that the inclination angle of the wiring is large in some practices is addressed, and the insulation layer above the wiring is prevented from cracking, and thus the quality of the display substrate is ensured.

Figure 7:
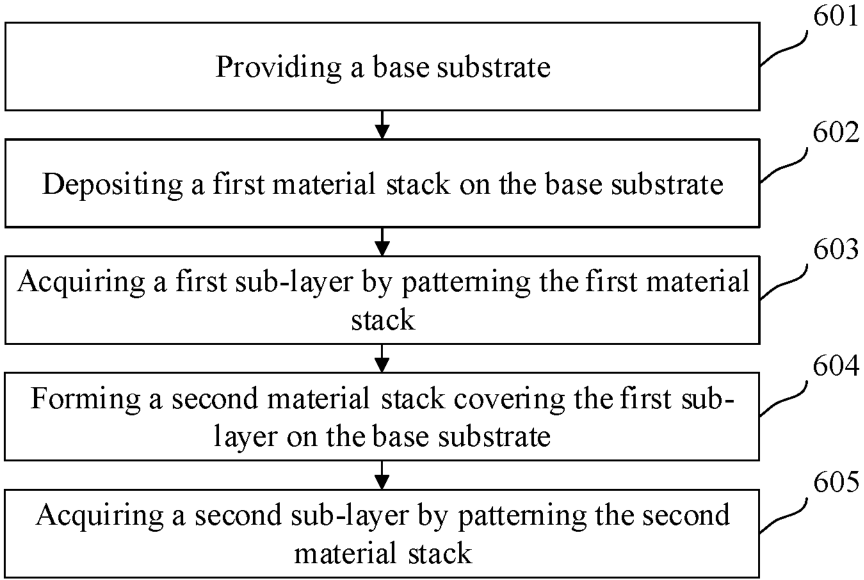
FIG. 7 is a flowchart of another method for manufacturing a display substrate according to some embodiments of the present disclosure.

FIG. 7 is a flowchart of another method for manufacturing a display substrate according to some embodiments of the present disclosure. Referring to FIG. 7, the method includes the following steps.

In step 601, a base substrate is provided.

In some embodiments of the present disclosure, the base substrate is a glass substrate, a resin substrate, or another type of substrate.

Optionally, upon step 601 step and prior to step 602, the method further includes: forming a buffer layer on the base substrate; forming an active layer on the buffer layer; and forming a second insulation layer on the active layer.

Exemplarily, the buffer layer includes a plurality of sub-layers, such as including two inorganic sub-layers and two organic sub-layers.

Exemplarily, the active layer is an LTPS layer. The LTPS has the advantages of high mobility and great stability, which satisfies the requirements of a display with a high resolution.

Exemplarily, the second insulation layer is an inorganic layer or an organic layer.

Exemplarily, the second insulation layer is a silicon nitride layer or an annular resin layer.

In step 602, a first material stack is deposited on the base substrate.

The first material stack includes an intermediate material and protection materials disposed on both sides of the intermediate material.

Exemplarily, the protection material is Ti and the intermediate material is Al.

Figure 8:
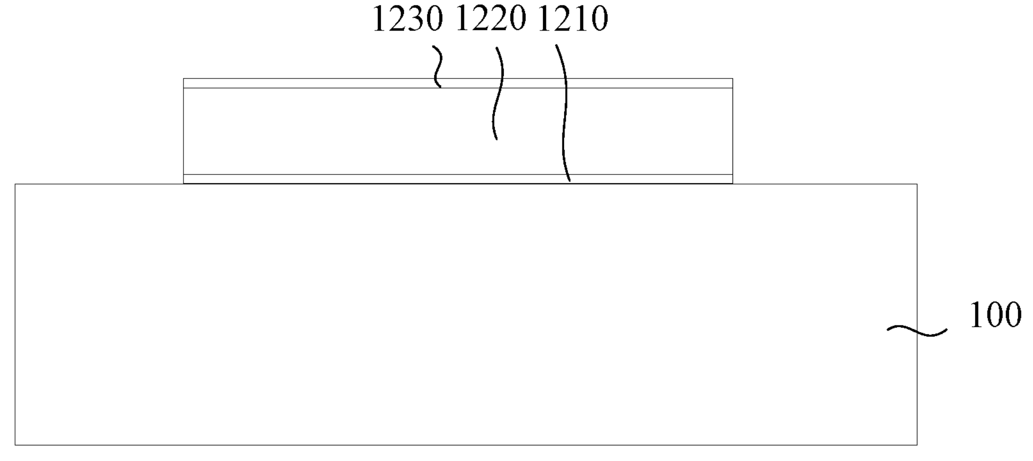
FIG. 8 is a schematic diagram of layers during manufacturing of a display substrate according to some embodiments of the present disclosure.

As illustrated in FIG. 8, the first material stack is formed by successively depositing a Ti layer 1210, an Al layer 1220, and a Ti layer 1230 on the base substrate 100.

In step 603, a first sub-layer is acquired by patterning the first material stack.

The first sub-layer is a stack structure. The stack structure includes an intermediate layer and protection layers disposed on two sides of the intermediate layer. The intermediate layer and the protection layer are conductive layers, and a resistance of the intermediate layer is less than a resistance of the protection layer.

Figure 9:
FIG. 9 is a schematic diagram of layers during manufacturing of a display substrate according to some embodiments of the present disclosure.
Figure 9:
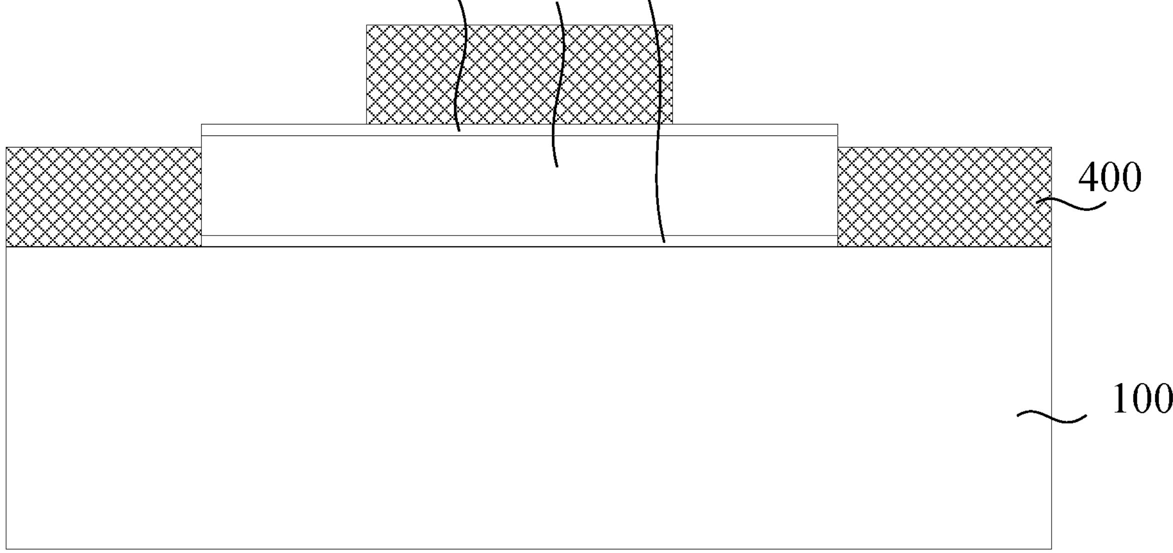

As illustrated in FIG. 9, a photoresist 400 is coated on the base substrate 100 and the first material stack, and a portion, to be etched away, of the first material stack is exposed.

Figure 10:
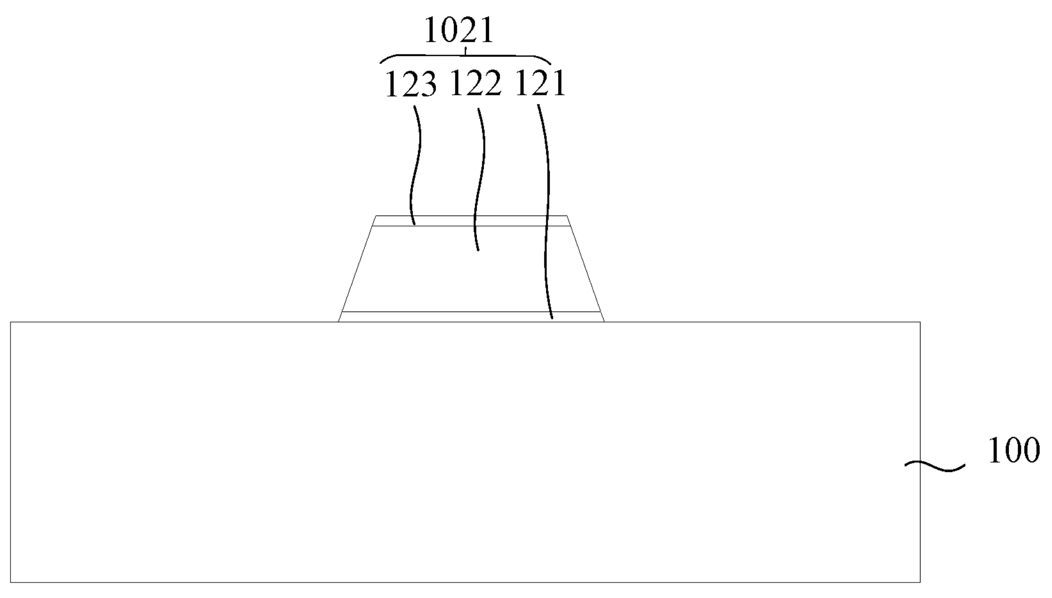
FIG. 10 is a schematic diagram of layers during manufacturing of a display substrate according to some embodiments of the present disclosure.

As illustrated in FIG. 10, the first material stack is etched by dry etching, and the first sub-layer 1021 is acquired by removing the photoresist 400 upon the completion of dry etching.

In some embodiments of the present disclosure, a ratio of a thickness of the protection layer to a thickness of the intermediate layer ranges from 1:5 to 1:10. The ratio of the thicknesses is a ratio of a thickness of a single protection layer to a thickness of a single intermediate layer. In the stack structure, the thicknesses of different protection layers are the same or different, and the thicknesses of different intermediate layers are the same or different.

Using a Ti/Al/Ti structure as an example, the wiring is mainly made of Al due to the small resistance of Al, and thus a thickness of an Al layer is large; and a Ti layer is used to wrap the Al layer to preventing the Al layer from being subject to high temperature and having bulges and burrs, and thus a thickness of the Ti layer is small.

Exemplarily, the ratio of the thickness of the protection layer to the thickness of the intermediate layer is 1:5.

In other embodiments, the ratio of the thickness of the protection layer to the thickness of the intermediate layer is another value, which is not limited herein.

In step 604, a second material stack covering the first sub-layer is formed on the base substrate.

The second material stack includes an intermediate material and protection materials disposed on two sides of the intermediate material.

Exemplarily, the protection material is Ti and the intermediate material is Al.

Figure 11:
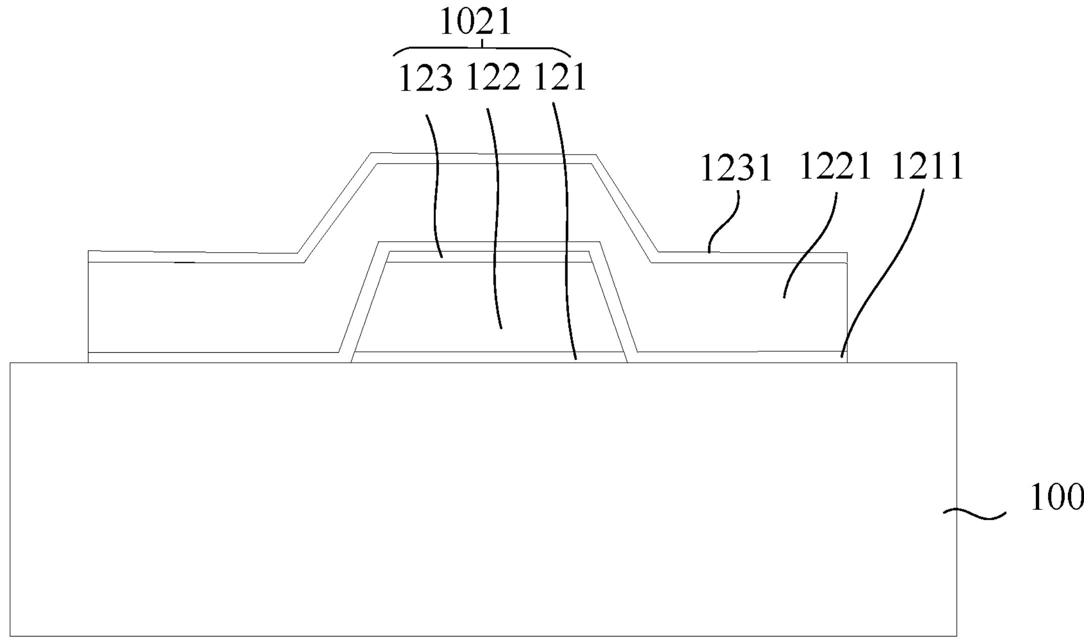
FIG. 11 is a schematic diagram of layers during manufacturing of a display substrate according to some embodiments of the present disclosure.

As illustrated in FIG. 11, the second material stack is formed by successively depositing a Ti layer 1211, an Al layer 1221, and a Ti layer 1231 on the base substrate 100.

In step 605, a second sub-layer is acquired by patterning the second material stack.

The second sub-layer is a stack structure. The stack structure includes an intermediate layer and protection layers disposed on two sides of the intermediate layer. The intermediate layer and the protection layer are conductive layers, and a resistance of the intermediate layer is less than a resistance of the protection layer.

Figure 12:
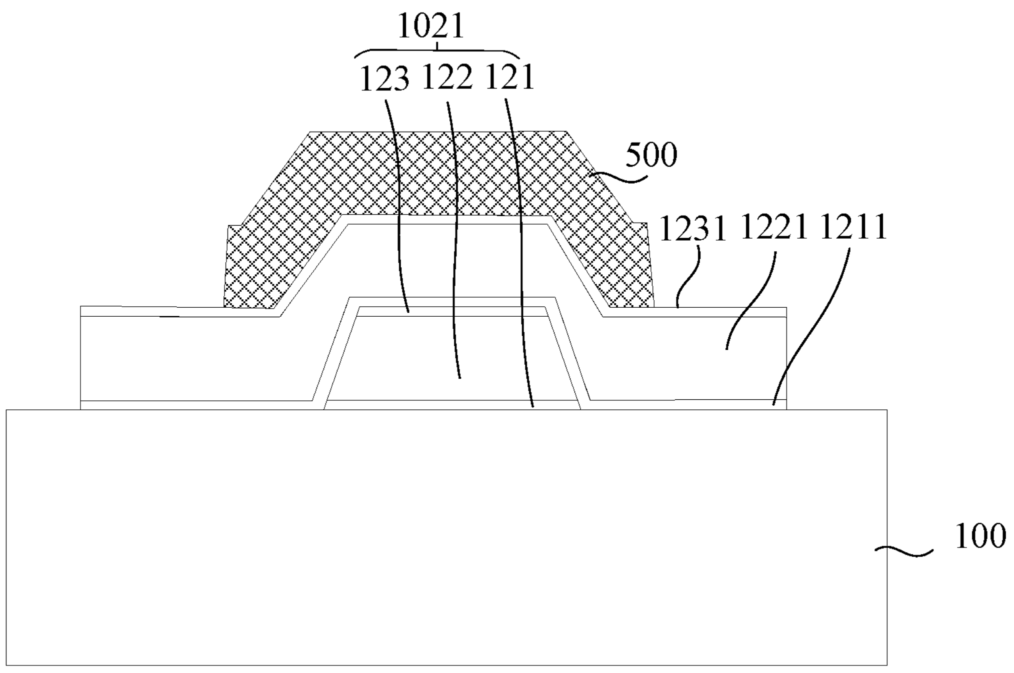
FIG. 12 is a schematic diagram of layers during manufacturing of a display substrate according to some embodiments of the present disclosure.

As illustrated in FIG. 12, a photoresist 500 is coated on the second material stack, and a portion, to be etched away, of the second material stack is exposed.

Figure 13:
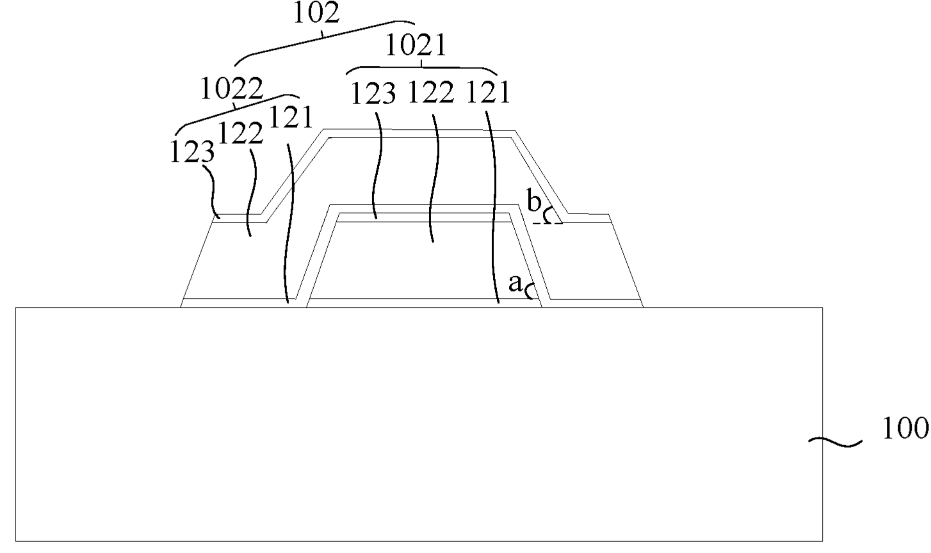
FIG. 13 is a schematic diagram of layers during manufacturing of a display substrate according to some embodiments of the present disclosure.

As illustrated in FIG. 13, the second material stack is etched by dry etching, and the second sub-layer 1022 is acquired by removing the photoresist 500 upon the completion of dry etching.

The first sub-layer and the second sub-layer described above together form the wiring, which is a gate electrode wiring.

In some embodiments of the present disclosure, an included angle b between a second inclined surface of the second sub-layer and a bearing surface of the base substrate ranges from 20 to 50 degrees.

Exemplarily, the included angle b between the second inclined surface and the bearing surface of the base substrate ranges from 30 to 40 degrees. For example, the included angle b is 30 degrees.

By depositing a material of the second sub-layer 1022 on the base substrate on which the first sub-layer 1021 is formed, the included angle b between the acquired second inclined surface and the bearing surface of the base substrate ranges from 30 to 40 degrees, which is significantly reduced compared with the included angle of 70 to 90 degrees between the etched inclined surface, acquired by dry etching, of the wiring and the bearing surface of the base substrate in some practices. During deposition of the material of the second sub-layer on the first inclined surface, due to a first inclined surface of the first sub-layer, the material slides down from the first inclined surface, such that a thickness of the material at a bottom of the first inclined surface is greater than a thickness of the material at a top of the first inclined surface, and in this case, an inclination angle of the formed second inclined surface is reduced. The inclination angle of the second inclined surface is related to the type of the deposited material. Using the Ti/Al/Ti stack structure as an example, the included angle b between the acquired second inclined surface and the bearing surface of the base substrate usually ranges from 30 to 40 degrees.

It should be noted that an included angle between an inclined surface, acquired by performing dry etching on the second sub-layer 1022, and the bearing surface of the base substrate does not change a lot compared with an included angle of the inclined surface of the first sub-layer 1021 and the bearing surface of the base substrate. In some embodiments of the present disclosure, the small inclination angle of the inclined surface of the second sub-layer 1022 is mainly due to the small inclination angle of the inclined surface formed by depositing the second sub-layer 1022 on the inclined surface of the first sub-layer 1021, and the formed inclined surface is opposite to an insulation layer above the inclined surface, such that the stress on the insulation layer is reduced and thus the crack is avoided.

In the case that the second sub-layer is formed, the method further includes the following step.

The wiring is disposed between the base substrate and a first insulation layer by forming an insulation layer covering the wiring on the base substrate.

Optionally, in the case that the second sub-layer is formed, the method further includes the following step.

A source-drain electrode layer, a first planarization layer, a spacer layer, a first encapsulation layer, an anode layer, a pixel definition layer, a light-emitting layer, a cathode layer, a second planarization layer, and a second encapsulation layer are successively formed.

Figure 14:
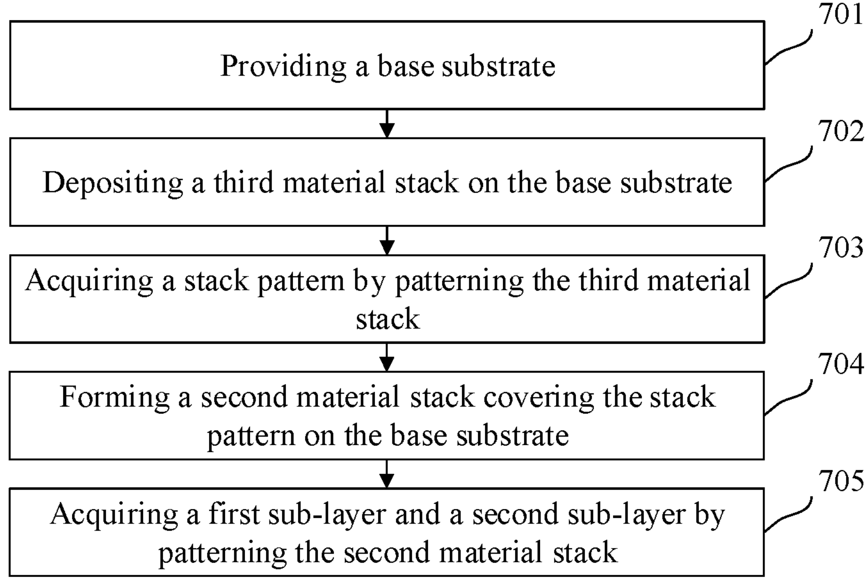
FIG. 14 is a flowchart of still another method for manufacturing a display substrate according to some embodiments of the present disclosure.

FIG. 14 is a flowchart of still another method for manufacturing a display substrate according to some embodiments of the present disclosure. Referring to FIG. 14, the method includes the following steps.

In step 701, a base substrate is provided.

For details of step 701, reference is made to step 601.

In step 702, a third material stack is deposited on the base substrate.

The third material stack includes an intermediate material and a protection material disposed between the intermediate material and the base substrate.

A difference between step 702 and step 602 only lies in that one less layer of the protection materials is deposited in step 702.

In step 703, a stack pattern is acquired by patterning the third material stack.

For details of step 703, reference is made to step 603. Although only 2 layers of materials are etched in step 703, the etching process and the acquired pattern are the same as in step 603.

In step 704, a second material stack covering the stack pattern is formed on the base substrate.

For details of step 704, reference is made to step 604.

In step 705, a first sub-layer and a second sub-layer are acquired by patterning the second material stack.

The first sub-layer and the second sub-layer are both a stack structure. The stack structure includes an intermediate layer and protection layers disposed on two sides of the intermediate layer. Contact surfaces of the first sub-layer and the second sub-layer share the same protection layer. The intermediate layer and the protection layer are conductive layers, and a resistance of the intermediate layer is less than a resistance of the protection layer.

For details of step 705, reference is made to step 605.

It should be noted that in the above manufacturing process, the third material stack is formed in step 702, and the second material stack is formed in step 704, which has the advantage that a lower surface of the intermediate layer in the second sub-layer is completely in contact with the protection layer, and thus the protection layer prevents a high temperature below the protection layer.

In other embodiments, the second material stack is formed in step 702, and a fourth material stack (including the intermediate material and the protection material that are successively stacked on the first sub-layer) is formed in step 704. In this way, the contact surfaces of the first sub-layer and the second sub-layer share the same protection layer, but the lower surface of the intermediate layer in the second sub-layer has difficulty being completely in contact with the protection layer.

Some embodiments of the present disclosure further provide a display device. The display device includes a power supply and the display substrate as described above. The power supply is connected to the display substrate.

The display device according to the embodiments of the present disclosure is a smartphone, a tablet computer, a television, a display, a notebook computer, a digital photo frame, a navigator, or any other product or component with a display function.

In some embodiments of the present disclosure, the first sub-layer and the second sub-layer covering the first sub-layer are formed on the base substrate, wherein the second sub-layer includes the first portion stacked on the first inclined surface of the first sub-layer, the side wall of the first portion is the second inclined surface, and the included angle between the second inclined surface and the bearing surface of the base substrate is less than the included angle between the first inclined surface and the bearing surface of the base substrate. In this way, the included angle between the inclined surface, proximal to the insulation layer above the wiring, of the wiring and the bearing surface of the base substrate is small, such that the problem that the inclination angle of the wiring is large in some practices is addressed, and the insulation layer above the wiring is prevented from cracking, and thus the quality of the display substrate is ensured.

Described above are merely exemplary embodiments of the present disclosure, and are not intended to limit the present disclosure. Therefore, any modifications, equivalent substitutions, improvements, and the like made within the spirit and principles of the present disclosure shall be included in the protection scope of the present disclosure.

What is claimed is:

1. A display substrate, comprising: a base substrate, a wiring, and a first insulation layer; wherein the first insulation layer covers the wiring; and the wiring comprises a first sub-layer and a second sub-layer; wherein the first sub-layer is disposed on the base substrate, a side wall of the first sub-layer being a first inclined surface, the second sub-layer is disposed on the base substrate and covers the first sub-layer, and the second sub-layer comprises a first portion stacked on the first inclined surface, a side wall of the first portion being a second inclined surface, wherein an included angle between the second inclined surface and a bearing surface of the base substrate is less than an included angle between the first inclined surface and the bearing surface of the base substrate, wherein the first sub-layer and the second sub-layer are both a stack structure; wherein the stack structure comprises an intermediate layer and protection layers disposed on two sides of the intermediate layer, the intermediate layer and the protection layer being conductive layers, a resistance of the intermediate layer being less than a resistance of the protection layer.

2. The display substrate according to claim 1, wherein the first sub-layer and the second sub-layer are both a stack structure; wherein the stack structure comprises an intermediate layer and protection layers disposed on two sides of the intermediate layer, and contact surfaces of the first sub-layer and the second sub-layer share a same one of the protection layers, the intermediate layer and the protection layer being conductive layers, a resistance of the intermediate layer being less than a resistance of the protection layer.

3. The display substrate according to claim 1, wherein the protection layer is a Ti layer, and the intermediate layer is an Al layer.

4. The display substrate according to claim 1, wherein a ratio of a thickness of the protection layer to a thickness of the intermediate layer ranges from 1:5 to 1:10.

5. The display substrate according to claim 1, wherein the included angle between the second inclined surface and the bearing surface of the base substrate ranges from 20 to 50 degrees.

6. The display substrate according to claim 1, wherein the first insulation layer is an inorganic layer.

7. The display substrate according to claim 1, wherein the wiring is a gate electrode wiring, a source-drain electrode wiring, a common electrode wiring, or a power supply wiring.

8. A method for manufacturing a display substrate, comprising:

providing a base substrate;

forming a wiring on the base substrate, wherein the wiring comprises a first sub-layer and a second sub-layer;

wherein the first sub-layer is disposed on the base substrate, a side wall of the first sub-layer being a first inclined surface, the second sub-layer is disposed on the base substrate and covers the first sub-layer, and the second sub-layer comprises a first portion stacked on the first inclined surface, a side wall of the first portion being a second inclined surface, wherein an included angle between the second inclined surface and a bearing surface of the base substrate is less than an included angle between the first inclined surface and the bearing surface of the base substrate; and forming an insulation layer covering the wiring on the base substrate, wherein forming the wiring on the base substrate comprises:

depositing a first material stack on the base substrate, wherein the first material stack comprises an intermediate material and protection materials disposed on two sides of the intermediate material;

acquiring the first sub-layer by patterning the first material stack;

forming a second material stack covering the first sub-layer on the base substrate, wherein the second material stack comprises an intermediate material and protection materials disposed on two sides of the intermediate material; and acquiring the second sub-layer by patterning the second material stack;

wherein the first sub-layer and the second sub-layer are both a stack structure, wherein the stack structure comprises an intermediate layer and protection layers disposed on two sides of the intermediate layer, the intermediate layer and the protection layer being conductive layers, a resistance of the intermediate layer being less than a resistance of the protection layer.

9. The method according to claim 8, wherein forming the wiring on the base substrate comprises:

depositing a third material stack on the base substrate, wherein the third material stack comprises an intermediate material and a protection material disposed between the intermediate material and the base substrate;

acquiring a stack pattern by patterning the third material stack;

forming a second material stack covering the stack pattern on the base substrate, wherein the second material stack comprises an intermediate material and protection materials disposed on two sides of the intermediate material; and acquiring the first sub-layer and the second sub-layer by patterning the second material stack;

wherein the first sub-layer and the second sub-layer are both a stack structure, wherein the stack structure comprises an intermediate layer and protection layers disposed on two sides of the intermediate layer, and contact surfaces of the first sub-layer and the second sub-layer share a same one of the protection layers, the intermediate layer and the protection layer being conductive layers, a resistance of the intermediate layer being less than a resistance of the protection layer.

10. A display device, comprising a power supply, and a display substrate; wherein the power supply is connected to the display substrate; and the display substrate comprises: a base substrate, a wiring, and a first insulation layer; wherein the first insulation layer covers the wiring; and the wiring comprises a first sub-layer and a second sub-layer; wherein the first sub-layer is disposed on the base substrate, a side wall of the first sub-layer being a first inclined surface, the second sub-layer is disposed on the base substrate and covers the first sub-layer, and the second sub-layer comprises a first portion stacked on the first inclined surface, a side wall of the first portion being a second inclined surface, wherein an included angle between the second inclined surface and a bearing surface of the base substrate is less than an included angle between the first inclined surface and the bearing surface of the base substrate, wherein the first sub-layer and the second sub-layer are both a stack structure; wherein the stack structure comprises an intermediate layer and protection layers disposed on two sides of the intermediate layer, the intermediate layer and the protection layer being conductive layers, a resistance of the intermediate layer being less than a resistance of the protection layer.

11. The display device according to claim 10, wherein the first sub-layer and the second sub-layer are both a stack structure; wherein the stack structure comprises an intermediate layer and protection layers disposed on two sides of the intermediate layer, and contact surfaces of the first sub-layer and the second sub-layer share a same one of the protection layers, the intermediate layer and the protection layer being conductive layers, a resistance of the intermediate layer being less than a resistance of the protection layer.

12. The display device according to claim 10, wherein the protection layer is a Ti layer, and the intermediate layer is an Al layer.

13. The display device according to claim 10, wherein a ratio of a thickness of the protection layer to a thickness of the intermediate layer ranges from 1:5 to 1:10.

14. The display device according to claim 10, wherein the included angle between the second inclined surface and the bearing surface of the base substrate ranges from 20 to 50 degrees.

15. The display device according to claim 10, wherein the first insulation layer is an inorganic layer.

16. The display device according to claim 10, wherein the wiring is a gate electrode wiring, a source-drain electrode wiring, a common electrode wiring, or a power supply wiring.

* * * * *